United States Patent [19]

Berman

[11] Patent Number: 4,823,291

[45] Date of Patent: Apr. 18, 1989

[54] RADIOMETRIC MEASUREMENT OF WAFER TEMPERATURES DURING DEPOSITION

[75] Inventor: Herbert L. Berman, Los Altos Hills, Calif.

[73] Assignee: Sensor Control, Inc., Sunnyvale, Calif.

[21] Appl. No.: 95,378

[22] Filed: Sep. 10, 1987

[51] Int. Cl.$^4$ .......................... G01J 5/10; G01K 1/02
[52] U.S. Cl. ................................. 364/557; 250/338.1; 356/43; 356/435; 374/45; 374/124
[58] Field of Search ............... 374/124, 130, 126, 127, 374/129, 45; 364/480, 490, 557; 250/338; 356/43

[56] References Cited

U.S. PATENT DOCUMENTS

| | | | |
|---|---|---|---|
| 3,264,931 | 8/1966 | Ackerman et al. | 374/130 X |
| 3,722,282 | 3/1973 | Loy | 374/130 |
| 3,765,779 | 10/1973 | Hunt | 374/129 X |
| 3,916,690 | 11/1975 | Brandli | 374/124 X |
| 3,930,730 | 1/1976 | Laurens | 374/130 X |
| 4,141,247 | 2/1979 | Schlick | 374/205 X |
| 4,150,573 | 4/1979 | Iinuma et al. | 374/170 X |
| 4,233,512 | 11/1980 | Rupert | 374/130 X |
| 4,243,327 | 1/1981 | Frosch et al. | 374/43 |
| 4,365,307 | 12/1982 | Tatsuwaki et al. | 364/557 |
| 4,498,765 | 2/1985 | Herve | 374/126 X |
| 4,557,607 | 12/1985 | Busse | 374/130 X |
| 4,566,809 | 1/1986 | Arnaud | 374/126 |
| 4,666,297 | 5/1987 | Gonzalez | 374/127 X |
| 4,679,946 | 7/1987 | Rosencwaij et al. | 374/57 X |

Primary Examiner—Daniel M. Yasich
Attorney, Agent, or Firm—Flehr, Hohbach, Test, Albritton & Herbert

[57] ABSTRACT

An infrared heat source is directed through a chopper or modulator and beam splitter to the surface of the wafer. A pair of radiometers are provided, one located behind the back surface of the wafer to measure transmittance, the other adjacent to the beam splitter to measure wafer reflectance. The wafer temperature may then be calculated using an experimentally determined relationship between wafer radiance $W_W$ and wafer temperature, with wafer radiance being provided by the relationship $$W_w = \left[ \frac{S_1' - W_a}{e_W r_{BS}} \right] + W_a$$

where $r_{BS}$ is the reflectance of the beam splitter, $W_W$ is the blackbody radiance of the wafer, $W_a$ is the blackbody radiance equivalent to ambient temperature, and $e_W$ is the wafer emittance. Alternatively, rather than locate a radiometer behind the wafer to measure wafer transmittance, a mirror may be located behind the wafer to reflect the transmitted energy back through the wafer on a periodic basis for a short part of each duty cycle. A single radiometer can then measure both the reflected and transmitted energy.

4 Claims, 1 Drawing Sheet

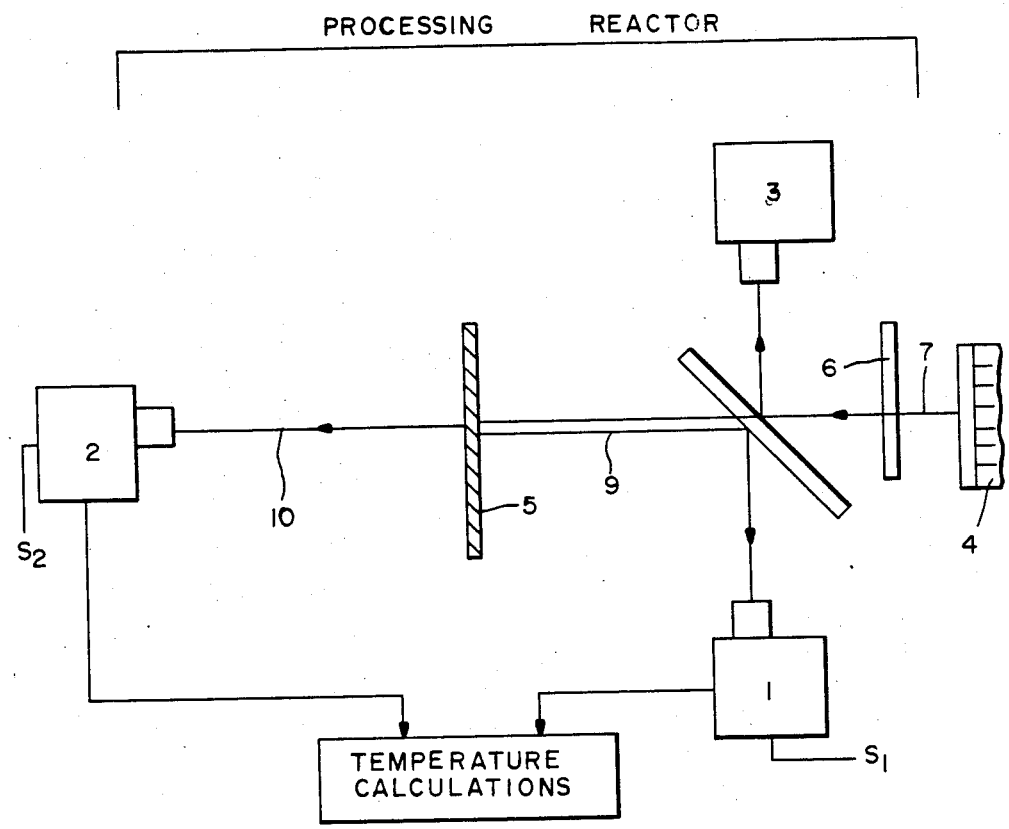
FIG.—1
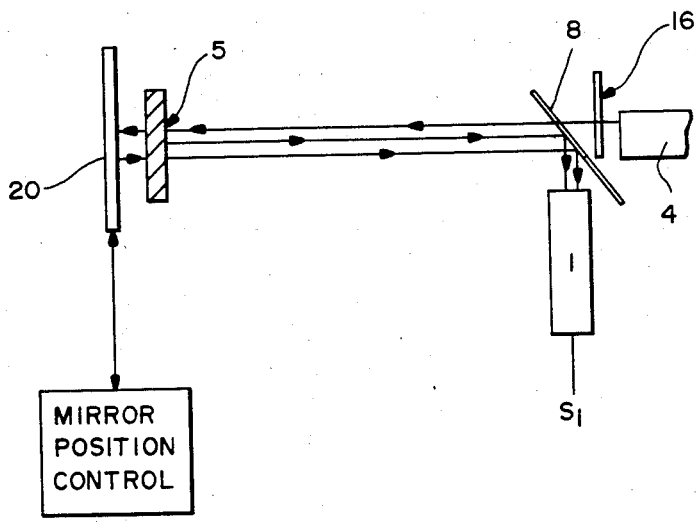
FIG.—2

RADIOMETRIC MEASUREMENT OF WAFER TEMPERATURES DURING DEPOSITION

FIELD OF THE INVENTION

This invention is directed to the field of semiconductor wafer processing and more particularly to an improved method for temperature measurement of a wafer during processing of the wafer.

BACKGROUND OF THE INVENTION

During processing of a wafer to form semiconductor devices, accurate temperature control and monitoring of the wafer is critical to an effective process. Variations in the temperature can affect the dimensions of the devices, and therefore, the reproducibility of the process.

To date, the common technique for measuring wafer temperatures is the use of a thermocouple. In using a thermocouple, it is put directly on the silicon wafer or on a monitor chip that sits near the silicon wafer. However, a thermocouple has a finite thermal mass. Therefore, it will modify the temperature of the water. Using the thermocouple on a monitor wafer is also relatively inaccurate, since it is at a distance from the wafer being processed, it cannot truly represent the temperature distribution on the wafer being processed. Further, the wafer being processed is not subject to the disturbing effects of the thermocouple and therefore, the temperature distribution on the wafer being processed and the monitor wafer are not truly identical. Further, use of the thermocouple has a high probability of introducing contamination on the surface of the wafer, because thermocouples are metallic elements.

The more common technique today is used of a pyrometer, a non-contact temperature measurement technique. However, the classic use of pyrometry is extremely sensitive to surface optical properties, and therefore a wafer that has not been processed will have different emission characteristics than a wafer whose surface has been processed. Therefore, the difficulty with this process as presently practiced lies in the changing optical properties of the wafer as the layers are added to the surface of the silicon wafer.

SUMMARY OF THE INVENTION

Therefore, it is an object of this invention to provide a non-invasive method for accurate temperature measurement of a wafer under process.

It is a further objective of this invention to provide a more accurate method of constantly monitoring the temperature of a wafer being processed.

More particularly, it is an objective herein to provide a measure of wafer temperature based on measurements of reflectance and transmittance of the wafer, with emittance of the wafer being calculated to provide a measure of wafer temperature in real time during the processing of the wafer.

It is a further objective herein to provide a wafer temperature measurement system that may be directly incorporated into existing processing systems without major structural modifications of the system.

In summary, this invention uses an infrared heat source directed through a chopper or modulator and beam splitter to the surface of the wafer. A pair of radiometers are provided, one located behind the back surface of the wafer to measure transmittance, the other adjacent to the beam splitter to measure wafer reflectance. The wafer temperature may then be calculated using an experimentally determined relationship between wafer radiance $w_w$ and wafer temperature, with wafer radiance being provided by the relationship $$W_w = \left[\frac{S_1' - W_a}{e_W r_{BS}}\right] + W_a$$

where $r_{BS}$ is the reflectance of the beam splitter, $W_W$ is the blackbody radiance of the wafer, $W_a$ is the blackbody radiance equivalent to ambient temperature, and $e_w$ is the wafer emittance.

In a preferred alternative embodiment, rather than locate a radiometer behind the wafer to measure wafer transmittance, a mirror may be located behind the wafer to reflect the transmitted energy back through the wafer on a periodic basis for a short part of each duty cycle. A single radiometer can then measure both the reflected and transmitted energy.

BRIEF DESCRIPTION OF THE DRAWINGS

The features and advantages of this invention will be better understood by the following detailed description of a preferred embodiment which is given with reference to the accompanying drawings wherein:

FIG. 1 shows the configuration of the wafer infrared source and radiometers for an embodiment using a radiometer behind the wafer and adjacent to the wafer; and FIG. 2 shows illustrates an alternative embodiment using a single radiometer and a mirror located behind the wafer to measure transmittance.

DESCRIPTION OF A PREFERRED EMBODIMENT

When a heated wafer is measured using an infrared thermometer, the temperature accuracy depends primarily on the knowledge of wafer emittance. An infrared source 4 is located outside the wafer processing reactor (not shown), providing radiant heating to wafer 5 through a window. A chopper 6 interrupts the radiant emissions 7 at regular intervals, preferably operating at a 50% duty cycle. The emissions reach the wafer through a beam splitter 8. Reflected energy from the wafer 9 reflects off the beam splitter to radiometer 1. Transmittance $t_w$ is measured by radiant energy 10 reaching radiometer 2. Although wafer emittance cannot be measured directly during the deposition process, it can be determined indirectly from the following relationships:

$$r_w + a_w + t_w = 1 \tag{1-1}$$

$$a_w = e_w \tag{1-2}$$

so that $$r_w + e_w + t_w = 1, \tag{1-3}$$

where $r_w$, $a_w$, $e_w$, $t_w$ are the wafer reflectance, absorptance, emittance, and transmittance, respectively.

The present method is based on measurements of reflectance and transmittance with emittance calculated from Eq. (1-3). The measurements are made during the deposition process and wafer temperature is determined "on-line" by a dedicated computer using the relationships derived in the following sections.

FIG. 1 shows the configuration of the wafer, infrared source, and radiometers. Radiometer 1 is used to measure wafer reflectance; radiometer 2 measures transmittance; and radiometer 3 is part of the source control loop.

REFLECTANCE MEASUREMENT

When the source is blocked, the signal from radiometer 1 is given by $$S_1' = e_w r_{BS}(W_w - W_a) + W_a, \quad (1\text{-}4)$$

where $r_{BS}$ is the reflectance of the beam splitter; $W_w$ is the blackbody radiance of the wafer; and $W_a$ is the blackbody radiance equivalent to ambient temperature.

Solving Eq. (1-4) for wafer radiance, $$W_w = \left[\frac{S_1' - W_a}{e_w r_{BS}}\right] + W_a \quad (1\text{-}5)$$

Using a look-up table for $W_w$ vs. temperature, the wafer temperature, $T_w$, is determined from the measured quantities in Eq. (1-5).

When the source is open, the signal from radiometer 1 is $$S_1 = t_{BS} r_w r_{BS}(W_s - W_a) + e_w r_{BS}(W_w - W_a) - W_a, \quad (2\text{-}1)$$

where $t_{BS}$ is the transmittance of the beam splitter; $W_s$ is the radiance of the source.

With the source blocked, the signal is $$S_1' = e_w r_{BS}(W_w - W_a) + W_a,$$

the signal difference is $$S_1 - S_1' = t_{BS} r_w r_{BS}(W_s - W_a) \quad (2\text{-}2)$$

To calibrate the system for reflectance, the wafer is replaced by a highly reflective mirror and the signal is $$S_{1c} = t_{BS} r_m r_{BS}(W_s - W_a) + w_a \quad (2\text{-}3)$$

where $r_m$ is the mirror reflectance.

With the source blocked, $$S_{1c}' = W_a,$$

so that $$S_{1c} - S_{1c}' = t_{BS} r_m r_{BS}(W_s - W_a) \quad (2\text{-}4)$$

The wafer reflectance is determined from $$\frac{S_1 - S_1'}{S_{1c} - S_{1c}'} = \frac{r_w}{r_m} \quad (2\text{-}5)$$

TRANSMITTANCE MEASUREMENT

When the source is open, the signal from radiometer 2 is $$S_2 = t_{BS} t_w(W_s - W_a) + e_w(W_w - W_a) \quad (3\text{-}1)$$

and with the source blocked, $$S_2' = e_w(W_w - W_a) \quad (3\text{-}2)$$

The signal difference is $$S_2 - S_2' = t_{BS} t_w(W_s - W_a) \quad (3\text{-}3)$$

To calibrate the system for wafer transmittance, the wafer is removed and the signal from radiometer 2 is $$S_{2c} = t_{BS}(W_s - W_a) \quad (3\text{-}4)$$

Transmittance is determined from $$t_w = \frac{S_2 - S_2'}{S_{2c}} \quad (3\text{-}5)$$

Referring to Eq. (1-5), the blackbody radiance of the water is $$W_w = \left[\frac{S_1' - W_a}{e_w r_{BS}}\right] + W_a$$

The emittance $e_w$ is determined from $$e_w = 1 - r_w - t_w = \quad (3\text{-}6)$$

$$1 - \left[\frac{r_m(S_1 - S_1')}{(S_{1c} - S_{1c}')}\right] - \left[\frac{(S_2 - S_2')}{S_{2c}}\right]$$

The reflectances of the beam splitter ($r_{BS}$) and the mirror ($r_m$) are measured independently. The ambient radiance ($W_a$) is measured by intermittently blocking radiometer 1.

The above values are calculated in an appropriately programmed computer 11;

Wafer temperature is determined using a look-up table of calibrated values of $W_w$ as a function of blackbody temperature.

ALTERNATIVE METHOD

The alternative embodiment of FIG. 2 is substantially similar to the embodiment of FIG. 1, with the exception that no radiometer is provided behind the wafer. Rather, a mirror 20 is provided behind the wafer together with control means 22 for moving the mirror 20 from a position behind the wafer where the transmitted energy can be reflected back toward the beam splitter, and then out from behind the wafer. By providing this movement controller, the effects of using a mirror on the actual operating temperature of the wafer are minimized. Further, the elimination of the radiometer behind the wafer eliminates the need for a special window in the processing reactor behind the surface of the wafer.

Rather, a quartz window which is cooled can now be used between the lamp source and the surface of the wafer. By providing a shutter 16 operating with a 1-second 50% duty cycle and interposing the mirror only a fraction of the duty cycle (perhaps 0.2 seconds), the effect of the presence of the mirror 20 on the wafer 5 is minimized, but the transmittance is still accurately measured. A theoretical derivation of the measurement of $r_w$ and $t_w$ (wafer reflectance and transmittance) follows below, with the symbols used in the equations being the same as those used in the set of equations used to describe the embodiment of FIG. 1, except in the situation where a specific alternative definition is given.

Shutter open, no mirror:

$$S_1 = e_{wf}(W_w - W_a)r_{BS} + e_s(W_s - W_a)r_{wf}t_{BS}r_{BS} + W_a$$

Shutter closed, no mirror:

$$S_1' = e_{wf}(W_w - W_a)r_{BS} + W_a$$

Shutter open, mirror:

$$S_1'' = e_{wf}(W_w - W_a)r_{BS} + e_s(w_s - W_a)r_{wf}t_{BS}r_{BS} + e_{wb}(W_w - W_a)r_m t_w r_{BS} + e_s(W_s - W_a)t_{BS}t_w r_m t_w r_{BS} + W_a$$

Shutter closed, mirror:

$$S_1''' = e_{wf}(W_w - W_a)r_{BS} + e_{wb}(W_w - W_a)r_m t_w r_{BS} + W_a$$

$$S_1'' - S_1''' = e_s(W_s - W_a)r_{wf}t_{BS}r_{BS} + e_s(W_s - W_a)t_{BS}t_w^2 r_m r_{BS}$$

$$S_1 - S_1' = e_s(W_s - W_a)r_{wf}t_{BS}r_{BS}$$

$$\Delta = (S_1'' - S_1''') - (S_1 - S_1') = e_s(W_s - W_a)t_{BS}t_s^2 r_m r_{BS}$$

$$S_{1c} = e_w(W_s - W_a)r_m t_{BS}r_{BS} + W_a$$

$$\Delta / [S_{1c} - W_a] = t_w^2$$

$$t_w = [\Delta / (S_{1c} - w_a)]^{\frac{1}{2}}$$

$$r_w = r_m(s_1 - s_1')/s_{1c}$$

Alternative embodiments to this invention may become apparent to a person of skill in the art who studies this invention disclosure. Therefore, the scope of this invention is to be limited only by the following claims.

What is claimed:

1. Apparatus for measuring the temperature of a semiconductor wafer being processed in a processing reactor comprising a radiant source directed at said wafer, shutter means for intermittently interrupting radiation from said radiant source impinging on said wafer, a beam splitter for passing said radiation to said wafer, radiometer means cooperating with said beam splitter detecting the radiation emitted from, transmitted by and reflected by said wafer, and means for calculating the temperature of the wafer in real time based on the relationship $$W_w = \frac{S_1' - W_a}{e_W r_{BS}} + W_a$$

wherein $S_1'$ is the signal from said radiometer when said source is blocked by said shutter, $r_{BS}$ is the reflectance of the beam splitter, $W_a$ is the blackbody radiance equivalent to ambient temperature, $e_w$ is wafer emittance as determined by $e_w = 1 - r_w - t_w$ where $r_w$ is the reflectance of the wafer and $t_w$ is the transmittance of the wafer, and $W_w$ is the instantaneous blackbody radiance of the wafer, the instantaneous wafer temperature $T_w$ having a fixed known relationship to $W_w$.

2. Apparatus as claimed in claim 1 wherein the means for detecting the radiation transmitted by said wafer includes a mirror positioned on the side of said wafer distance from said radiant source to reflect transmitted energy back toward said beam splitter, and control means for interposing said mirror for a fraction of the duty cycle of said shutter, whereby the transmittance may be accurately measured without a radiometer located behind said wafer.

3. Apparatus as claimed in claim 1 wherein said radiant source is directed at said wafer from outside said reflector.

4. A method for measuring the temperature of a semiconductor wafer being processed in a processing reactor comprising directing a radiant source at said wafer, shutter means for intermittently interrupting radiation from said radiant source impinging on said wafer, passing said radiation to said wafer, detecting the radiation emitted from, transmitted by and reflected by said wafer, and calculating the temperature of the wafer in real time based on the relationship $$W_w = \left[\frac{S_1' - W_a}{e_W r_{BS}}\right] + W_a$$

wherein $S_1'$ is the signal from said radiometer when said source is blocked by said shutter, $r_{BS}$ is the reflectance of the beam splitter, $W_a$ is the blackbody radiance equivalent to ambient temperature, e is wafer emittance as determined by $e_w = 1 - r_w - t_w$ where $r_w$ is the reflectance of the wafer and t is the transmittance of the wafer, and $W_w$ is the instantaneous blackbody radiance of the wafer, the instantaneous wafer temperature $T_w$ having a fixed known relationship to $W_w$.

* * * * *